United States Patent [19]
Mantese et al.

[11] Patent Number: 5,512,196
[45] Date of Patent: Apr. 30, 1996

[54] FERROELECTRIC-FERROMAGNETIC COMPOSITE MATERIALS

[75] Inventors: Joseph V. Mantese, Troy; Adolph L. Micheli, Harrison Township; Dennis F. Dungan, Mt. Clemens, all of Mich.

[73] Assignee: General Motors Corporation, Detroit, Mich.

[21] Appl. No.: 265,899

[22] Filed: Jun. 27, 1994

Related U.S. Application Data

[63] Continuation-in-part of Ser. No. 915,582, Jul. 20, 1992, abandoned.

[51] Int. Cl.$^6$ .......................... C04B 35/26; C04B 35/468
[52] U.S. Cl. ...................... 252/62.9; 252/62.6; 501/137; 501/139
[58] Field of Search .................. 252/62.6, 62.9, 252/62.59; 501/137, 139; 333/182, 81 R

[56] References Cited

U.S. PATENT DOCUMENTS

| | | | |
|---|---|---|---|
| Re. 29,258 | 6/1977 | Fritz | 333/70 |
| 3,035,237 | 3/1958 | Schlicke | 333/79 |
| 3,243,738 | 11/1963 | Schlicke et al. | 333/79 |
| 3,789,263 | 1/1974 | Fritz et al. | 315/39.51 |

FOREIGN PATENT DOCUMENTS

| | | | |
|---|---|---|---|
| 0256350 | 2/1988 | European Pat. Off. | |
| 770890 | 3/1957 | United Kingdom | 252/62.6 |

OTHER PUBLICATIONS

Skinner, Selby M., "Magnetically Ordered Ferroelectric Materials", IEEE Trans. on Parts, Materials and Packaging, PMP-6 (2), Jun. 60, pp. 68–90.
Van den Boomgaard et al., "A Sintered Magnetoelectric Composite Material $BaTiO_3$–Ni(Co,Mn) $Fe_2O_4$" Jour. of Mater. Sci., 13 (1978), pp. 1538–1548.
Yamamoto et al., "Evaluation of Ferroelectric/Ferromagnetic Composite by Microcomposite Designing", Ferroelectrics, vol. 95, pp. 175–178, 1989.
Ivanov et al., "Magnetoelectric Effect in Terbium Molybdate", JEPT Lett., vol. 52, No. 7, 10 Oct. 1990, pp. 395–396.
Bracke et al., "A Broadband Magneto–electric Transducer Using a Composite Material", Int. J. Electronics, vol. 51(3), 1981 pp. 255–262.
Rottenbacher et al., "Ferroelectric Ferromagnetics", Ceramics International, vol. 7 (3), pp. 106–108, 1981.
Gelyasin et al., "Magnetoelectric Effect in the Barium Titanate–Nickel Ferrite Composite Ceramic", Sov. Phys. Tech. Phys., 33 (11) pp. 1361–1362 Nov. 1988.
Janes et al., "Europium Barium Titanate—A Magnetic Ferroelectric Compound", J. Appl. Phys., 49 (3), Mar. 1978, pp. 1452–1454.

Primary Examiner—C. Melissa Bonner
Attorney, Agent, or Firm—Cary W. Brooks

[57] ABSTRACT

A material which possesses both capacitive and inductive properties for suppressing electromagnetic interference is provided, wherein the material is a composite of a ferroelectric material and a ferromagnetic material. The ferroelectric-ferromagnetic composite material is formulated and processed so as to retain the distinct electrical properties of the individual constituents according to the relative quantities of the constituents present in the ferroelectric-ferromagnetic composite material. As a unitary composite element, the ferroelectric-ferromagnetic composite is readily formable to provide a compact electrical filter whose filtering capability is highly suitable for suppressing electromagnetic interference from sources internal and external to an automotive environment. The sintered composite has a very low porosity; interconnectivity between the ferroelectric and ferromagnetic phases; and has no chemical reaction between the ferroelectric and ferromagnetic phases to produce a third phase.

7 Claims, 11 Drawing Sheets

FERROELECTRIC-FERROMAGNETIC COMPOSITE MATERIALS

This is a continuation-in-part application of U.S. Ser. No. 07/915,582 filed Jul. 20, 1992, now abandoned.

The present invention generally relates to filtering elements used in conjunction with electrical connectors to suppress electromagnetic interference. More particularly, this invention relates to improved materials for such filtering elements, wherein the improvement pertains to a composite ferroelectric-ferromagnetic filter element which exhibits both capacitive and inductive filtering capabilities.

BACKGROUND OF THE INVENTION

In an automotive environment, electromagnetic interference (EMI) is often present in the form of stray radio frequency noise, cross-talk between electrical devices, and noise created by such things as the making and breaking of circuits, spark discharges, poor or intermittent metallic contact between metal bonds and components, and atmospheric interference. It is well known that such EMI sources pose a serious threat to the electrical integrity of electrical circuitry and the function of electrical components. As the dependence on electrical circuitry by modern automobiles increases, there is an increased need for effective electrical filters to reduce electromagnetic interference between individual electrical components and circuits. The difficulty of reducing such extraneous noise is further complicated by the desire to produce automobile electronics in smaller modules. In addition, low level signals associated with on-board sensors and computer systems requires better EMI filtering as switching electronics operate at higher voltages.

Currently, the predominant method of EMI filtering is to install capacitors on an electronic circuit board using conventional manufacturing technology. At times, an inductor is added to provide "LC-type" filtering, such as when a block inductor is placed in series with one or more discrete capacitors. The use of LC-type filtering is often necessary in that a capacitor will exhibit inductance at high frequencies, producing resonance which can seriously impair the effectiveness of an electronic device. However, as electronic devices become more compact, these types of filters take up increasingly valuable space on the circuit board. Furthermore, these filters do not always provide a sufficient level of protection in that they are extremely sensitive to frequency and thus application dependent. As a result, it is often necessary to narrowly tailor the capabilities of such filters to perform well for very specific applications.

It is also known to locate EMI filters, such as feed-through filters, at electrical interconnects to suppress cross-talk and other extraneous noise at the connector pins. Simple forms of such filters include a dielectric, and more preferably a ferroelectric ceramic tube plated on its interior and exterior surfaces with a metallic coating that serves as a pair of electrodes. The interior electrode is in electrical contact with a connector pin while the exterior electrode is in electrical contact with ground. The capacitance of the filter depends upon the surface area and thickness of the tube and the dielectric constant, or permittivity, of the ceramic material used. While such filters are adequate for many applications, they are prone to exhibit the aforementioned resonance at very high frequencies.

It is known to form the ceramic tube from a ferromagnetic material such as ferrite, and then sinter a ferroelectric material, such as barium titanate, to the exterior surface of the tube. The ferromagnetic material, characterized by having high permeability, provides inductance while the ferroelectric material, characterized by having high permittivity, provides capacitance between the ferromagnetic material and ground. As a result, the ferromagnetic and ferroelectric materials act together to provide an LC-type filter, wherein the inductive capability provided by the ferromagnetic material attenuates the resonance which otherwise occurs with the capacitive element at the higher frequencies. Examples of these types of EMI filters include U.S. Pat. No. 3,035,237 to Schlicke, U.S. Pat. No. 3,243,738 to Schlicke et al., U.S. Pat. No. 3,789,263 to Fritz et al., and U.S. Pat. No. Re. 29,258 to Fritz.

While the above EMI filters have advantageous features in terms of electromagnetic interference attenuation, they are not altogether economical to manufacture for purposes of the quantities typically required in automotive applications. Furthermore, single versus multi-component connectors are simpler to assemble and are believed to be less expensive to manufacture and store.

Materials are known which exhibit both ferroelectric and ferromagnetic, or magnetoelectric, properties. One class of such materials consist of compounds having a single crystalline phase. However, the permeability and permittivity of this group of materials are generally inadequate for technical applications because the optimum magnetoelectric properties of these compounds exist only at temperatures well below room temperature.

A more recently discovered group of magnetoelectric materials are formed from composites of fine grain powders of ferrite and lead zirconate titanate (PZT) which have been sintered together for evaluating magneto-strictive and electro-strictive effects—i.e., the contraction or expansion of a material when subjected to a magnetic or electrical field. However, lead is reactive with the ferrite, yielding a composite having greatly diminished permeability and permittivity as compared to its individual constituent materials. Such losses in constituent properties are well known to those skilled in the art.

FIG. 15 is a schematic of the electrical components of a prior art filtered-header-connector including as the filter element a block inductor and discrete compacitors.

FIG. 16 is an illustration of such a prior art filtered-header-connector 180 which includes a plurality of connecting pins 182 inserted through a block inductor 184. Each connector pin includes an individual discrete compacitor 186 which is soldered to a pin and a ground 187. Such devices involve numerous manufacturing steps to assemble and are time consuming and labor intensive.

FIG. 17 is a plot of the attenuation of a filter illustrated in FIG. 16. As can be seen from the plot, the attenuation can be characterized as a band pass filter because of L-C resonance of the capacitor/conductor and limitations of the ferrite.

In the making of filtered-headed-connectors for electronic components such as those used in automotive applications or other electronic applications, a wish list of desirable properties and characteristics of such filters can be imagined. A high resistivity would prevent shorting between adjacent connector pins. A high dielectric constant material would provide improved capacitance. A high permeability material would produce inductive capabilities and, of course, mechanical strength would provide for durability. The high resistivity, dielectric constant, permeability, and mechanical strength suggests high sintering temperatures. No single material is known to provide all of these properties. A few properties may be provided by one material and the balance provided by another material. However, simply mixing two materials together will not produce a composite which achieves the desired properties because of high porosity. If the mixture is sintered to remove the porosity, the permittivity permeability can be relative low. This is because when the two materials are sintered at high temperatures to achieve the desired characteristics highlighted above, the materials chemically react with each other resulting in lower permittivity, permeability and resistivity.

SUMMARY OF THE INVENTION

According to the present invention, there is provided a material which is a composite of a high permittivity ferroelectric material and a high permeability ferromagnetic material. As such, the ferroelectric-ferromagnetic composite material can be formed as a compact unitary element which singularly exhibits both inductive and capacitive properties so as to act as an LC-type electrical filter. The compactness, formability and filtering capability of such an element is therefore highly suitable for suppressing electromagnetic interference from sources internal and external to an automotive environment.

The ferroelectric-ferromagnetic composite includes a ferroelectric material and a ferromagnetic material which are combined and consolidated to form a solid composite material which is capable of suppressing electromagnetic interference at an electrical component or device. In the preferred embodiment, the ferroelectric material is barium titanate and the ferromagnetic material is a ferrite material, and more preferably based upon a copper zinc ferrite. The solid composite material is combined and consolidated in a manner that ensures that the microstructure of the solid ferroelectric-ferromagnetic composite is characterized by grains which are large enough to maintain their respective ferroelectric or ferromagnetic properties. As such, detrimental interaction between the ferroelectric and ferromagnetic materials is substantially absent, as determined by x-ray diffraction, so as to permit the materials to retain their permittivity and permeability properties, respectively.

The method by which the ferroelectric-ferromagnetic composite is formed entails combining ferroelectric and ferromagnetic materials in granular form. The quantity of each material used is chosen to effect the final properties of the ferroelectric-ferromagnetic composite. The preferred ratio of the two materials may vary widely, depending on the desired application.

Once sufficiently mixed, the mixture is pressed at a pressure and sintered at a temperature which are sufficient to minimize porosity in the resulting solid composite preform, and ultimately maximize the effective permittivity and permeability of the composite. In addition, the solid composite preform should exhibit sufficient strength and toughness to resist chipping and cracking, as well as permit preshaping.

The composite solid preform is then heated at a temperature and for a duration which is sufficient to sinter the ferroelectric and ferromagnetic materials together to form the ferroelectric-ferromagnetic composite without causing the individual constituents to react. Final shaping of the ferroelectric-ferromagnetic composite can use routine procedures known for ceramic materials.

Using the above processing method, the ferroelectric and ferromagnetic materials are able to retain their permittivity and permeability, respectively, such that the ferroelectric-ferromagnetic composite can posses both capacitive and inductive filtering capabilities. This result is highly unexpected, in that some reduction in the respective properties would be expected when combining materials to form a composite. However, no significant loss in electrical properties occurs. In the composite, the individual constituents maintain their high permeability and permittivity, though the effective permeability and effective permittivity of the composite is lessened as compared to the separate constituents.

Furthermore, the capacitive and inductive characteristics of the ferroelectric-ferromagnetic composites made according to the present invention exhibit attenuation capabilities which show no signs of leveling off at frequencies as high as 1 GHz. While the geometry of the ferroelectric-ferromagnetic composite will significantly effect the ultimate capacitive and inductive nature of an electrical filter formed accordingly, the processing parameters of the ferroelectric-ferromagnetic composite readily facilitate numerous variations which can further enable the particular properties of the device to be tuned to produce suitable attenuation for specific applications and environments.

These and other objects, features and advantages will be apparent from the following brief description of the drawings, detailed description and appended claims and drawings.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

A material which possesses both capacitive and inductive properties for suppressing electromagnetic interference is provided, wherein the material is a composite of a ferroelectric material and a ferromagnetic material. The term ferroelectric means having a hysteretic permittivity with electric field. The term ferromagnetic means having a hysteretic permeability with magnetic field. The ferroelectric-ferromagnetic composite material is formulated and processed so as to have discrete particles without appreciable reaction therebetween. As a result, the ferroelectric and ferromagnetic materials are able to retain their distinct electrical properties according to their relative quantities within the ferroelectric-ferromagnetic composite material.

Figure 1:
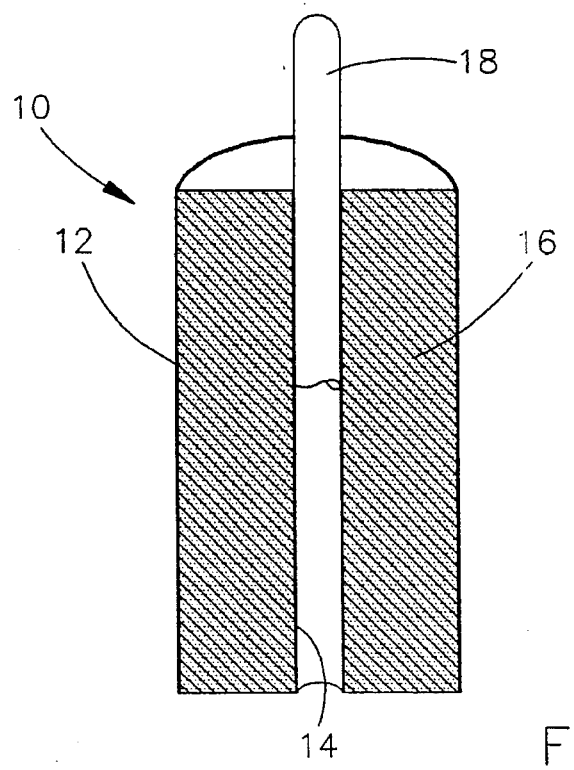
FIG. 1 shows in cross-section a ferroelectric-ferromagnetic composite device in accordance with this invention.

Referring specifically to FIG. 1, there is shown a ceramic bead 10 formulated and processed according to the present invention as an electrical filter for an electrical harness interconnect. The ceramic bead 10 includes a tubular-shaped member 16 formed from the ferroelectric-ferromagnetic composite material. Both the exterior and interior cylindrical surfaces of the tubular-shaped member 16 are coated with an electrically conductive material, such as a silver paste, which is fired to form a pair of electrodes 12 and 14. A connector pin 18 extending through the tubular-shaped member 16 is also shown. The connector pin 18 closely fits the inner diameter of the tubular-shaped member 16 to provide electrical contact therebetween. To complete the electrical filter, a ground wire or cable (not shown) is connected to the outer electrode 12.

While this particular configuration was used for testing various composite samples, as will be described in detail below, the ferroelectric-ferromagnetic composite material of this invention could foreseeably be employed in a variety of structures and applications. However, for comparison, substantially identical beads 10 of the type described were tested to eliminate geometrical effects as a factor in the performance of the beads 10 during evaluation.

According to the present invention, the ferroelectric-ferromagnetic composite is prepared from a composition composed of materials which, when combined, contribute properties to the ferroelectric-ferromagnetic composite which are similar to those of the constituent materials. To achieve this aspect, the individual constituent materials must essentially not react with one another in order to preserve their distinct crystalline phases because any interaction would significantly diminish the desired electrical properties, which occurs for all known composites formed for numerous other applications.

Widely separated sintering temperatures help to preserve the phase constituent separation and thus reduces the likelihood of an interaction between the constituents.

As such, the processing employed to form a unitary composite element, such as the ceramic bead 10, must begin with suitably sized ferroelectric and ferromagnetic particles. More specifically, the particles must be sufficiently sized so as to maintain their respective ferromagnetic and ferroelectric properties. Generally, the minimum particle diameter can be calculated according to the equation $(Dr)^{1/2}$, where D is the diffusion rate of intermixing the two constituents, and t is the time which the particles will be sintered. In addition, it is preferable that the selected ferroelectric and ferromagnetic materials have melting temperatures that differ significantly.

An additional factor in maintaining suitably high permittivity and permeability of the ferroelectric-ferromagnetic composite is the porosity of the composite. In particular, porosity has been shown to be extremely deleterious to the electrical properties of both ferroelectric and ferromagnetic materials, even at levels as low as 5 volume percent. Furthermore, porosity is known to contribute other detrimental effects to a ceramic composite, for example, low yield strength. The effect on manufacturing processes is to lower the yield in production, thereby increasing the average cost per unit. Accordingly, the processing employed to form the ferroelectric-ferromagnetic composite should also minimize the formation of porosity therein. The ferroelectric-ferromagnetic composite according to the present invention has a closed pore porosity from 0 to about 10 percent, preferably from substantially 0 to about 3 percent and most preferably from about 0 to less than 1 percent by volume of the composite or any percentage within these ranges. The term "closed pore porosity" as used herein means pores are not open to the outer surface of the sintered parts and/or the pores are closed so that no air or water can flow through the pores of the sintered part.

The ferroelectric material chosen for the ferroelectric-ferromagnetic composite is barium titanate ($BaTiO_3$), although other suitable ferroelectric materials could be used, such as barium strontium titanate, barium strontium niobate, and barium copper tantalate. However, barium titanate is the preferred material in part because it is a high dielectric material having large permittivity ($\kappa$) of about 1000 or higher at about 1 kHz. Furthermore, the permittivity of barium titanate can be enhanced by the addition of dopants. High purity material and proprietary blends can be purchased commercially, such as through TAM Ceramics Incorporated, of Niagara Falls, N.Y. The ferroelectric material may have a sintering point ranging from about 1300° C. to about 1400° C., preferably about 1350° C. to about 1400° C. The ferroelectric material is chosen to have a sintering temperature which is above that of the ferromagnetic material, preferably at least about 250° C. higher sintering point than the ferromagnetic material, so that the ferromagnetic material diffuses around the ferroelectric phase. This provides for the advantage of forming a structure of low porosity to provide a material having higher permeability, permittivity and low dielectric loss. Both the ferroelectric and ferromagnetic materials are evenly distributed through the composite, preferably so that the sintered composite does not contain open pore porosity. This provides the advantage of low dielectric loss.

The ferromagnetic material chosen for the ferroelectric-ferromagnetic composite is a ferrite, which is a high resistance magnetic material consisting principally of ferric oxide ($Fe_2O_3$) and one or more other oxides. The ferromagnetic material may have $AB_2O_4$ type formula where A is at least one selected from the group consisting of Cu, Mg, Zn, Ni and Mn; B includes primarily Fe. Component A may also be selected to include a low sintering component that lowers the overall melting point of the ferromagnetic material to about 250° C. less than the ferroelectric component. Copper is a preferred low sintering component. Component A may also be selected to include a high electrical resistivity component such as Mg, so that the electrical resistivity of the composite is at least $10^6$ or $10^7$ or $10^9$ or $10^{12}$ ohm cm. Mg may also be added as component A to insure high electrical resistivity. Component A may also be chosen to provide a high permeability component such as Zn, so that the permeability is at least 30 at 100 kHz or at least 1 at 100 MHz. The material may also be chosen to provide a high permeability, for example, 100 at 100 kHz. More preferably, the ferrite is copper-based ferrite because of the low sintering temperatures associated with such ferrites. Copper zinc magnesium ferrite with excess MgO ($Cu_{0.2}Mg_{0.4}Zn_{0.5}Fe_2O_4$) is exemplary of such copper-based ferrites, and was used extensively for tests reported herein. Copper based-ferrites have a permeability ($\mu$) of about 100 or higher at about 100 kHz. In addition, copper-based ferrites advantageously have lower sintering temperatures than barium titanate. Specifically, barium titanate sinters in air to full density at about 1400° C. and melts at about 1600° C., while copper zinc magnesium ferrite sinters in air to full density at about 1050° C. to about 1150° C. As a result, there is a lesser tendency for the barium titanate and the copper zinc magnesium ferrite to react and diminish their respective electrical properties when the composite is sintered at about 1100° C. to about 1300° C. depending on composition. For example, if the composite is about 30% by volume ferroelectric material, the sintering temperature is about 1100° C., and if the composite is bout 30% by volume ferromagnetic material, the sintering temperature is about 1300° C.

Both the ferroelectric and ferromagnetic material should each be present in at least about 30 volume percent of the composite, up to about 70 volume percent of the composite for example 35, 40, 45, 50, 55, 60 and 65 volume percent of the composite. The minimum amount of about 30 volume percent for each of the ferroelectric and ferromagnetic materials provides the advantage of interconnectivity of each phase. That is, the two phases are percolated.

The ferroelectric-ferromagnetic composite was prepared according to two methods. Each method entailed preparing the copper zinc magnesium ferrite by combining cupric oxide (CuO), zinc oxide (ZnO), magnesium oxide (MgO) and ferric oxide ($Fe_2O_3$) in appropriate amounts, and then ball milling, drying and calcinating the mixture at about 800° C. to about 850° C. for about one to about three hours. However, the preparation of the barium titanate was varied in order to evaluate the effect of grain size on the electrical properties, and particularly permittivity, of the ferroelectric-ferromagnetic composite.

The first method entailed combining fine grain barium titanate (particle size of about 1.0 micron) and fine grain copper-based ferrite (particle size of about 1.0 micron) using standard ball milling techniques, though other methods known in the art could also be used with suitable results. The powder mixture was then air dried at about 100° C., and isostatically pressed into a composite preform at a pressure of 45,000 psi. The preform was then fired in a standard tube furnace at about 1050° C. to about 1350° C. for about 1 hour in air or flowing oxygen. These parameters assured a minimum porosity and maximum density without interaction of the constituents.

The second method entailed processing the barium titanate prior to combining the two materials to yield larger grain sizes. Beads of the barium titanate were first formed by isostatically pressing granular (1.0 micron particles) barium titanate to about 45,000 psi and then sintering at about 1400° C. for about one hour in air or flowing oxygen (about 1 liter/minute). The beads were then fractured and pulverized, and then sieved through a 200 mesh screen. The particles which passed through the sieve were then collected and mixed with granular ferrite having a grain size of about 1 micron. Beads of the composite mixture were then prepared by isostatically pressing at about 45,000 psi, and then sintering at about 1050° C. to about 1350° C. for about one hour in air or flowing oxygen (about 1 liter/minute).

Each of the above processing methods produced a ferroelectric-ferromagnetic composite which preserved the granular structure of the individual materials and showed no interaction between the barium titanate and the copper zinc ferrite. Generally, no significant differences were detected in the electrical properties of the ferroelectric-ferromagnetic composites formed by either method, indicating that initial grain size of the constituents generally is not a significant factor. As a result, the test data reported is representative of either process.

For purposes of testing, the above methods were employed to form beads such as that shown in FIG. 1. The dimensions of the beads 10 included a length of about 0.4 inch, an outside diameter of about 0.25 inch, and a bore diameter of about 0.05 inch. The beads 10 were then coated with the silver electrodes 12 and 14 as shown. Beads 10 having different volume percent proportions of the ferroelectric and ferromagnetic materials were formed to evaluate the effect on electrical properties. As can be seen by reference to FIGS. 2 through 9, these proportion combinations included pure barium titanate (FIG. 2), pure copper zinc magnesium ferrite (FIG. 3), and various intermediate proportions thereof (FIGS. 4 through 9).

The ability of the test beads 10 to filter electromagnetic interference was evaluated using a conventional vector network analyzer which drove a variable frequency voltage source through the pin 18 into a 50 ohm load. The attenuation provided by each bead 10 can be seen in FIGS. 2 through 6. The graphs are numerically summarized in Table I below.

TABLE I

| COMPOSITE (VOLUME %) | ATTENUATION IN dB | | | |
|---|---|---|---|---|
| | 100 MHz | 200 MHz | 500 MHz | 1 GHz |
| 100% BaTiO3 | −19 dB | −21 dB | −21 dB | −28 dB |
| 100% ferrite | −7 dB | −8 dB | −8 dB | −9 dB |
| 12.5% BaTiO3 | −4 dB | −5 dB | −8 dB | −13 dB |
| 25% BaTiO3 | −3 dB | −6 dB | −14 dB | −24 dB |
| 37.5% BaTiO3 | −5 dB | −9 dB | −19 dB | −31 dB |
| 50% BaTiO3 | −8 dB | −12 dB | −23 dB | −37 dB |
| 62.5% BaTiO3 | −11 dB | −14 dB | −24 dB | −38 dB |
| 75% BaTiO3 | −14 dB | −15 dB | −23 dB | −36 dB |

Figure 2:
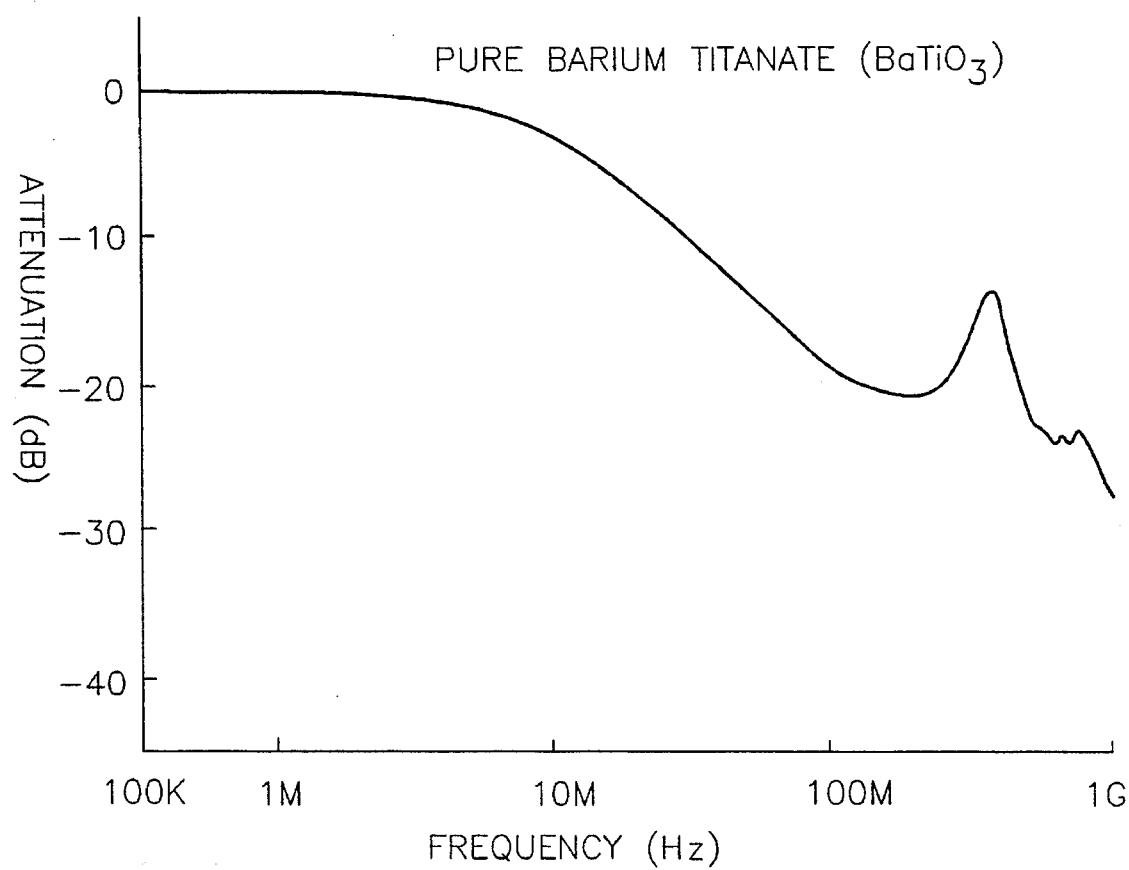
FIGS. 2 through 9 graphically show the attenuation capabilities of the bead of FIG. 1 formed from pure barium titanate, pure ferrite, and various intermediate proportions thereof.

FIG. 2 illustrates that the attenuation of the pure ferroelectric barium titanate bead 10 was quite dramatic, with the attenuation level exceeding about −20 dB at about 200 MHz. However, an intrinsic resonance created a pass-band at about 400 MHz. Conventionally, such a resonance would be eliminated with either placing an inductor in series with the barium titanate bead 10, or by adding a layer of a ferromagnetic material to the bead.

Figure 3:
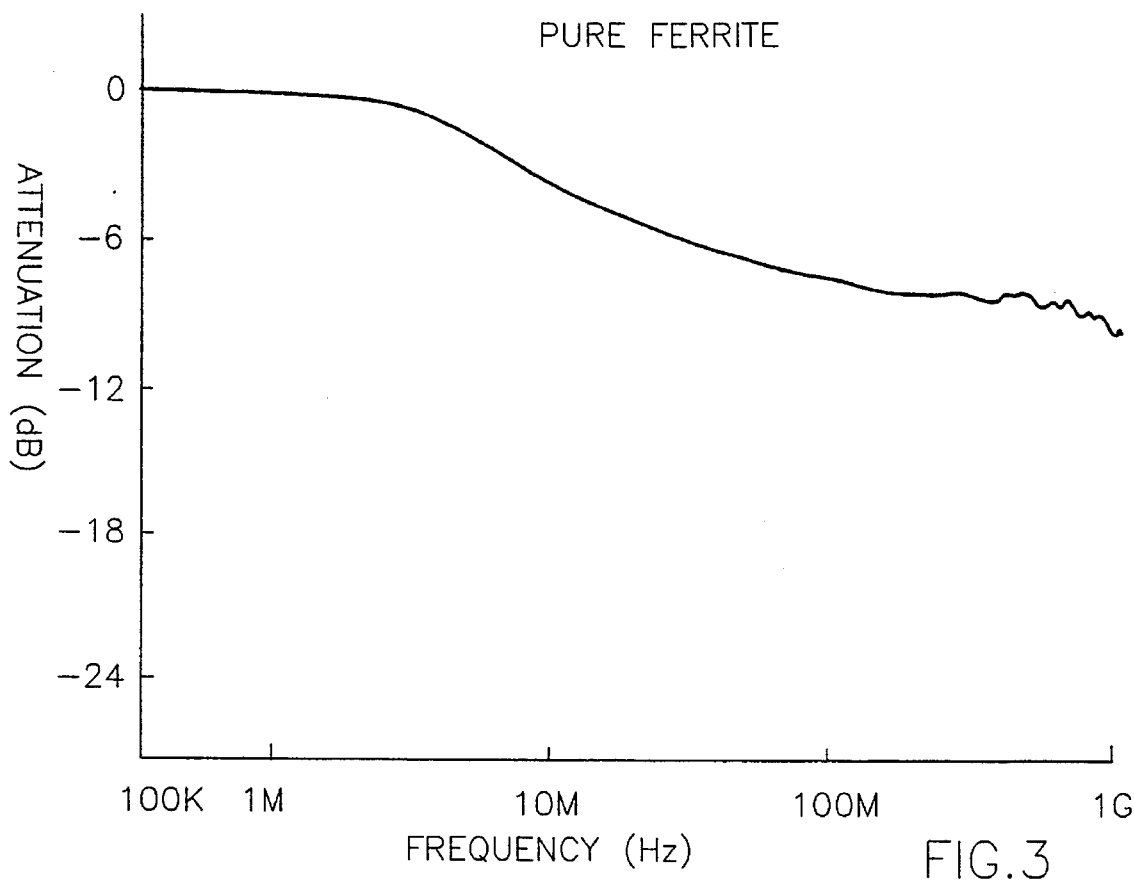
Figure 4:
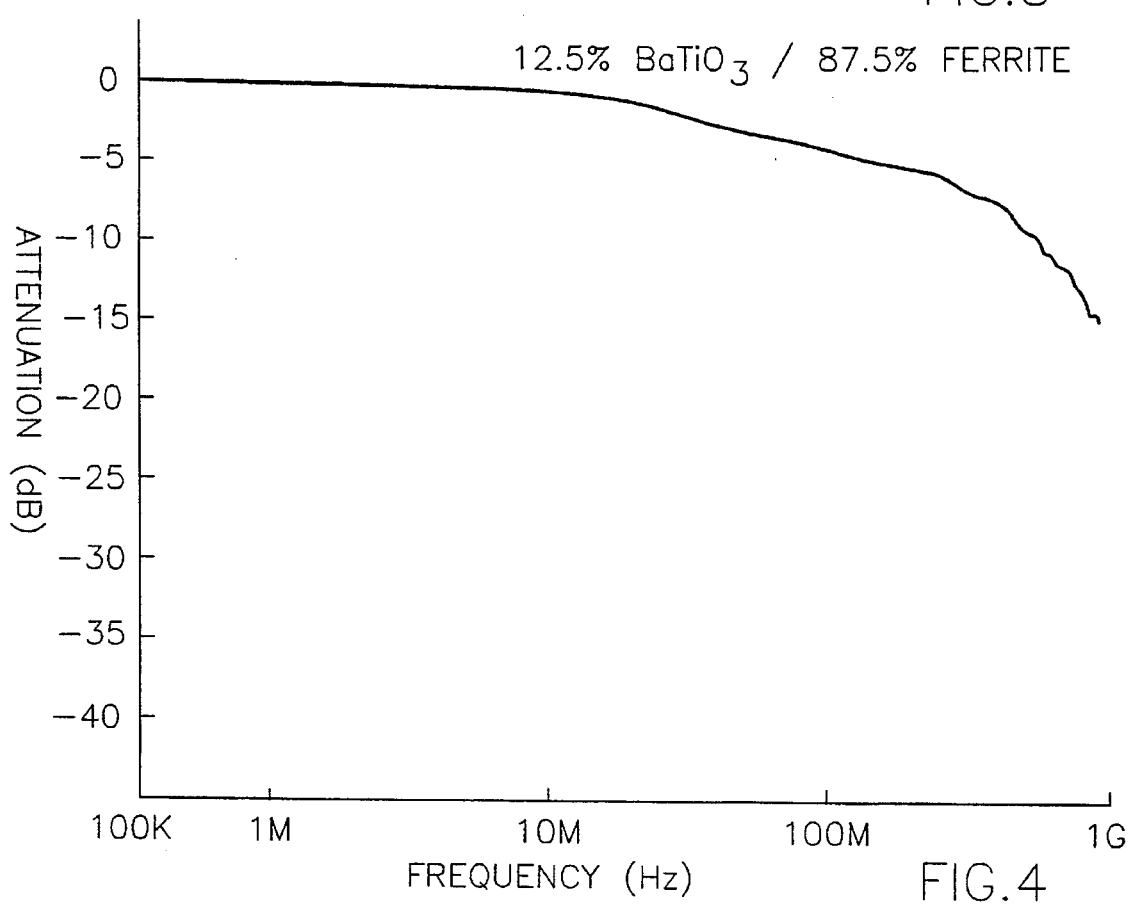
Figure 5:
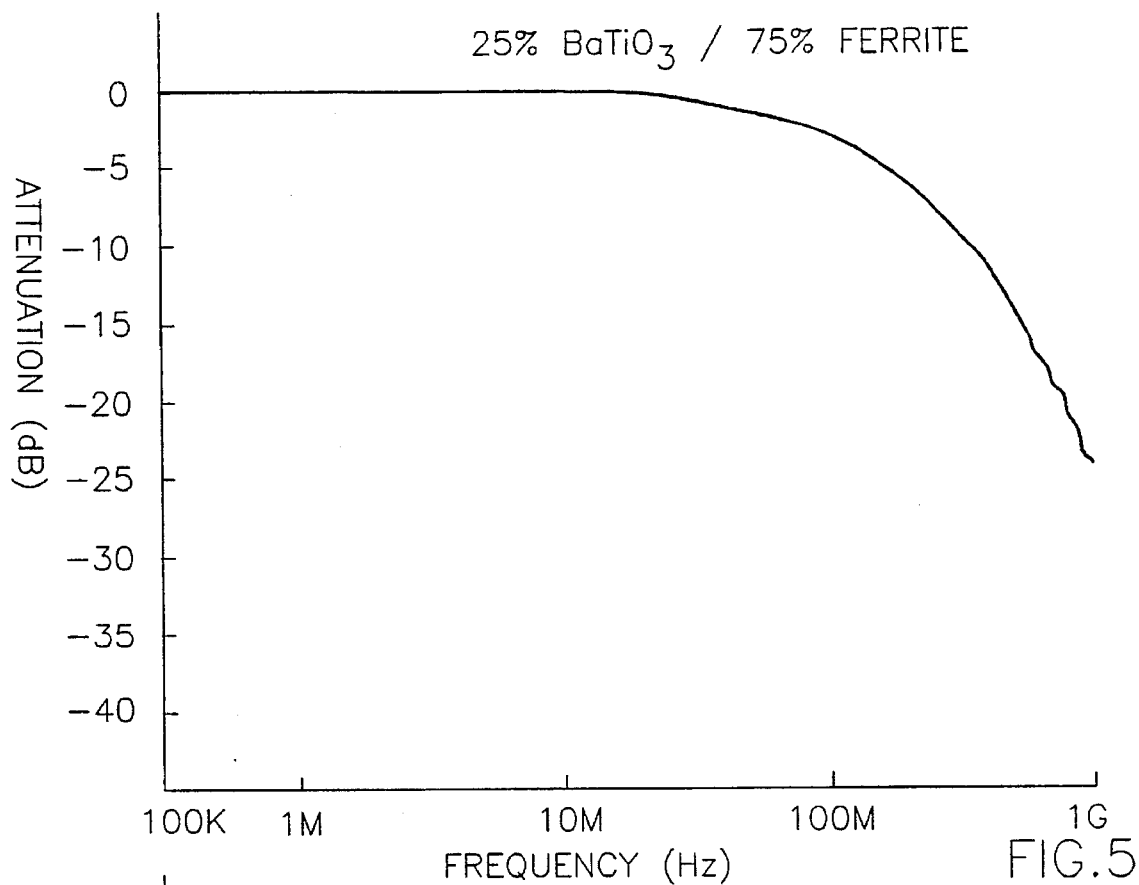
Figure 6:
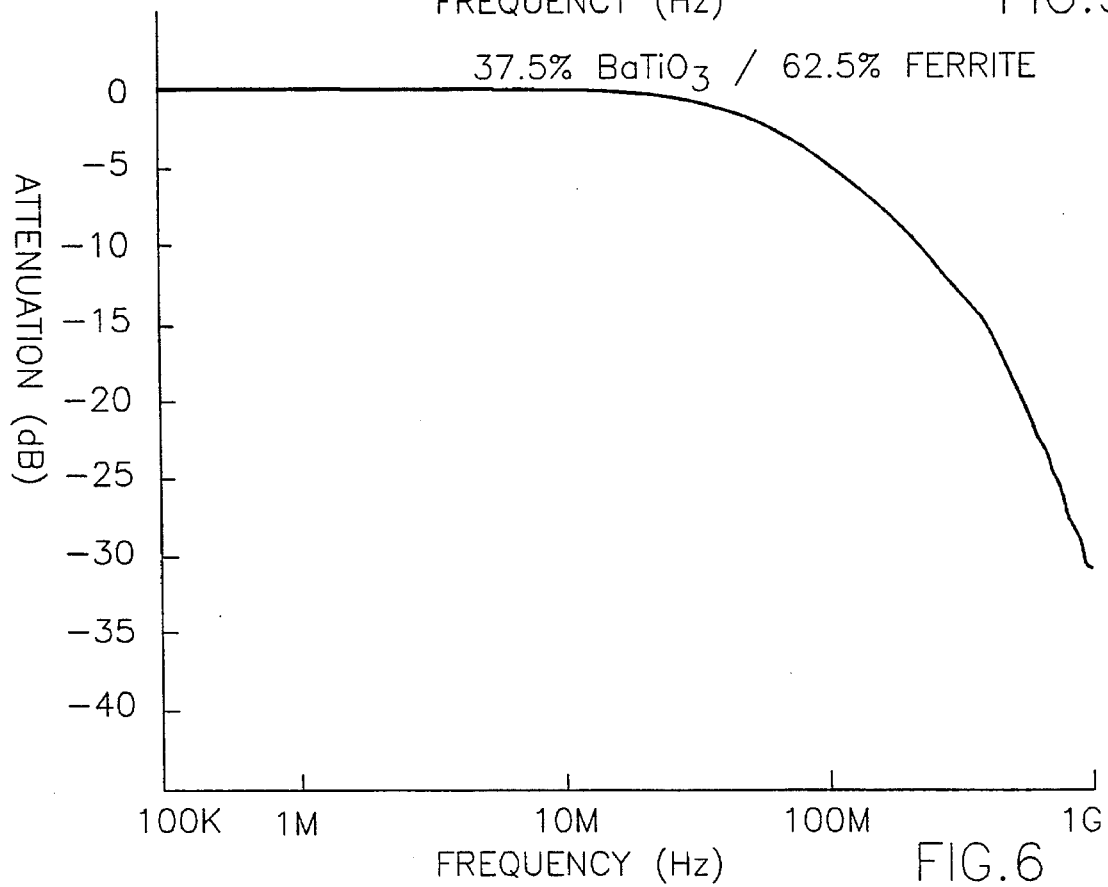
Figure 7:
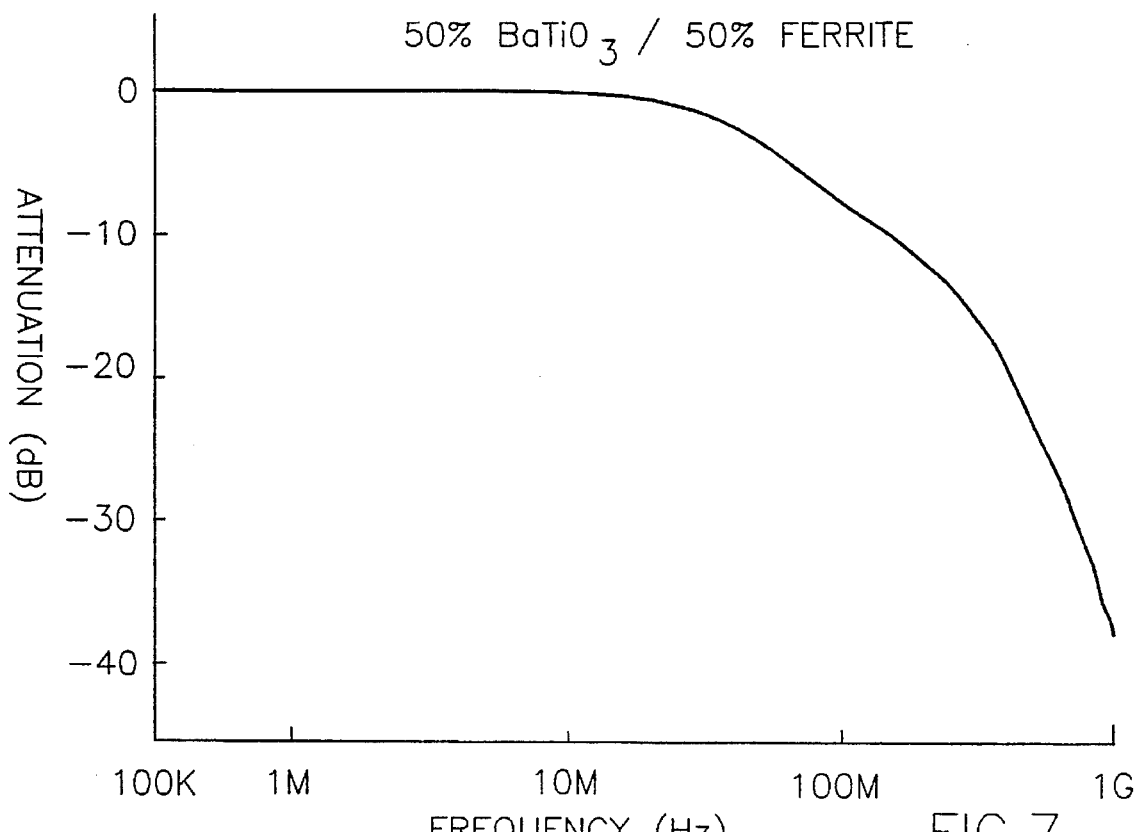
Figure 8:
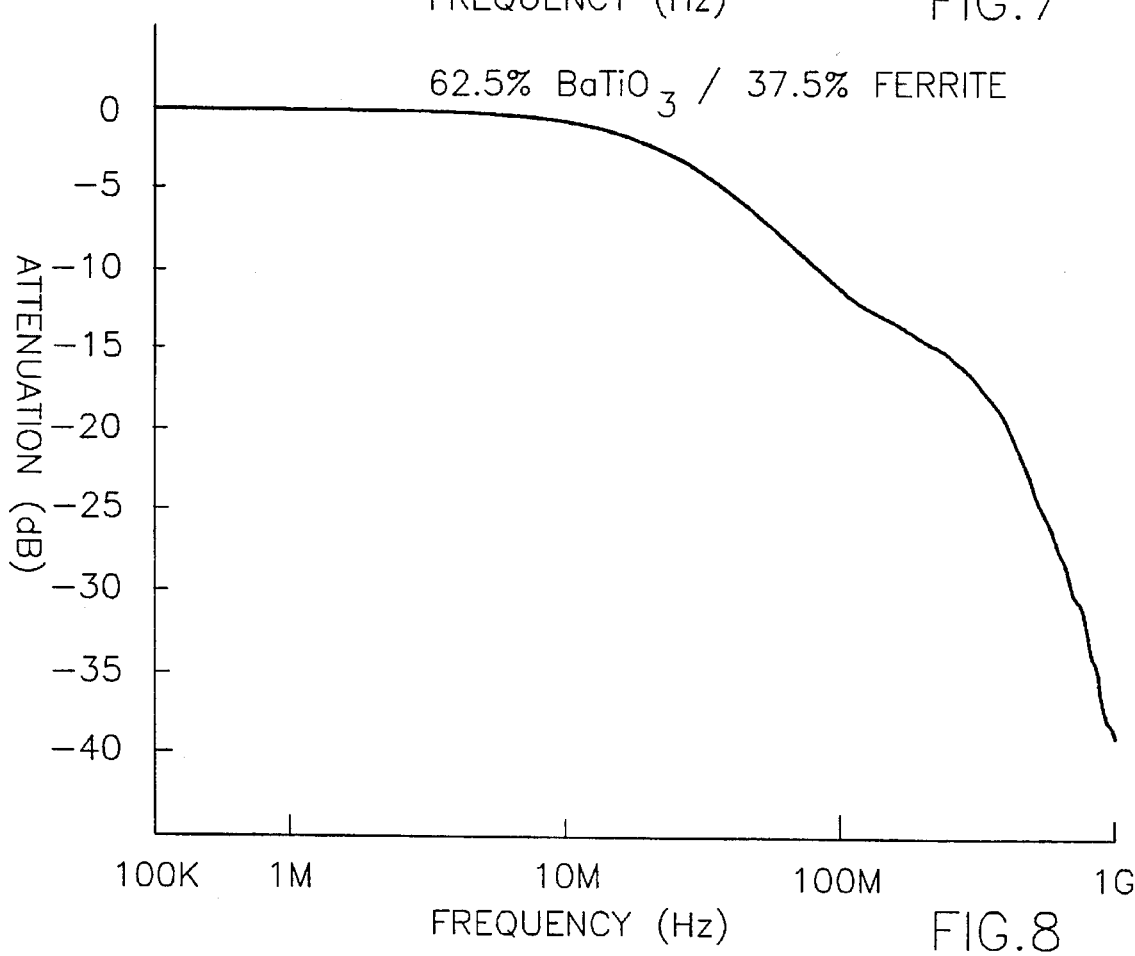
Figure 9:
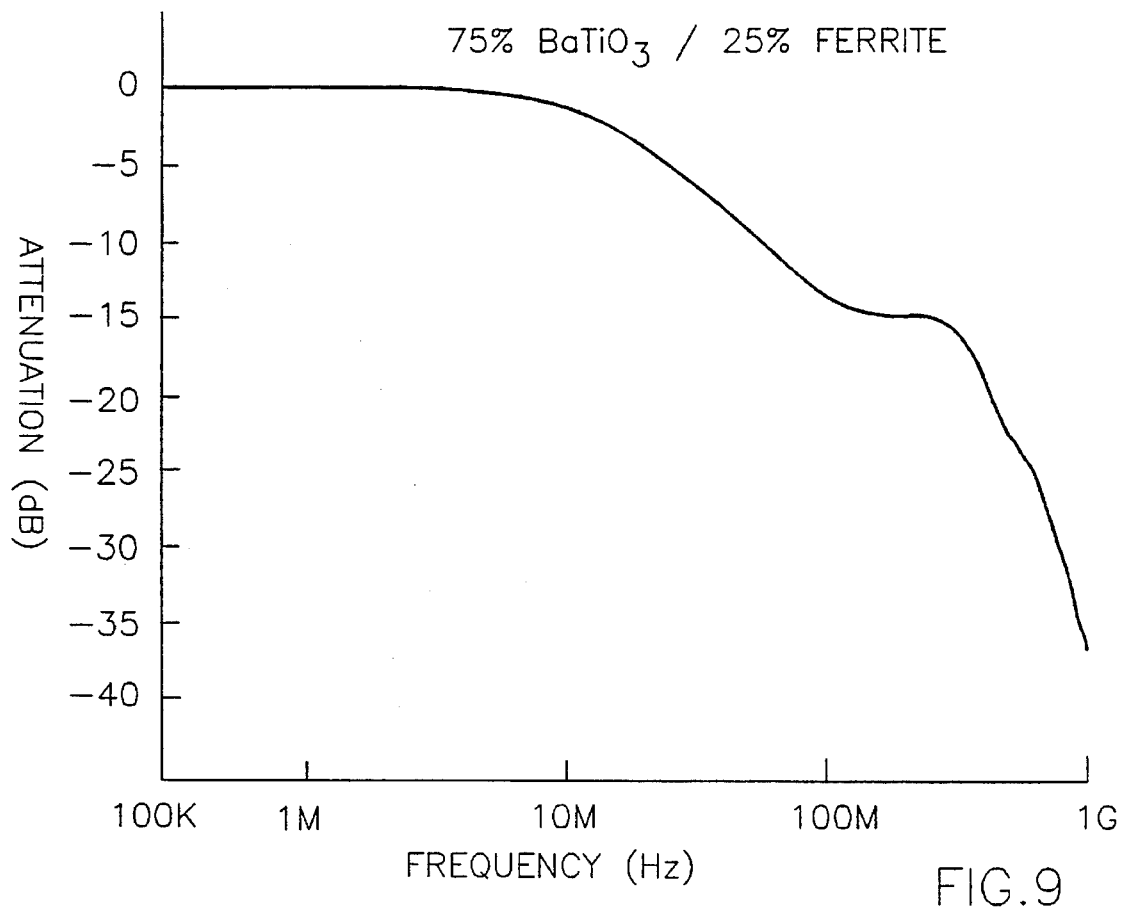

In contrast to the performance of the barium titanate bead 10, FIG. 3 shows that the electrical filtering properties of the pure ferromagnetic copper zinc magnesium ferrite bead 10 never exceeded −9 dB. FIGS. 4 through 9 illustrate the advantageous effects of combining barium titanate with copper zinc magnesium ferrite in accordance with the teachings of this invention. All six ferroelectric-ferromagnetic composites exhibited relatively little attenuation capability below about 10 MHz, particularly in comparison to the pure ferroelectric barium titanate and pure ferromagnetic copper zinc magnesium ferrite beads. However, the six ferroelectric-ferromagnetic composites were at least comparable to and more often superior to pure copper zinc magnesium ferrite at frequencies in excess of about 500 MHz, while those containing 50% barium titanate by volume were superior to pure copper zinc magnesium ferrite above 100 MHz.

Figure 13:
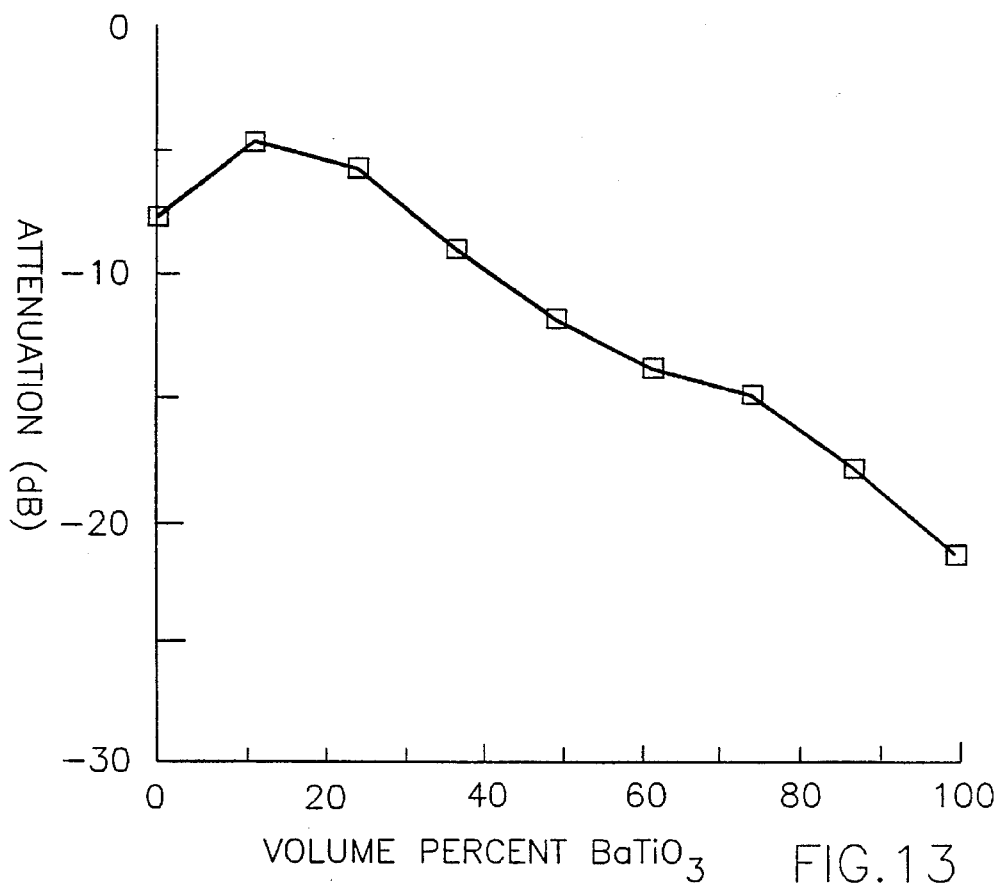
FIGS. 13 and 14 graphically show attenuation capability versus volume percent barium titanate for the bead of FIG. 1 at 200 MHz and 1 GHz.
Figure 14:
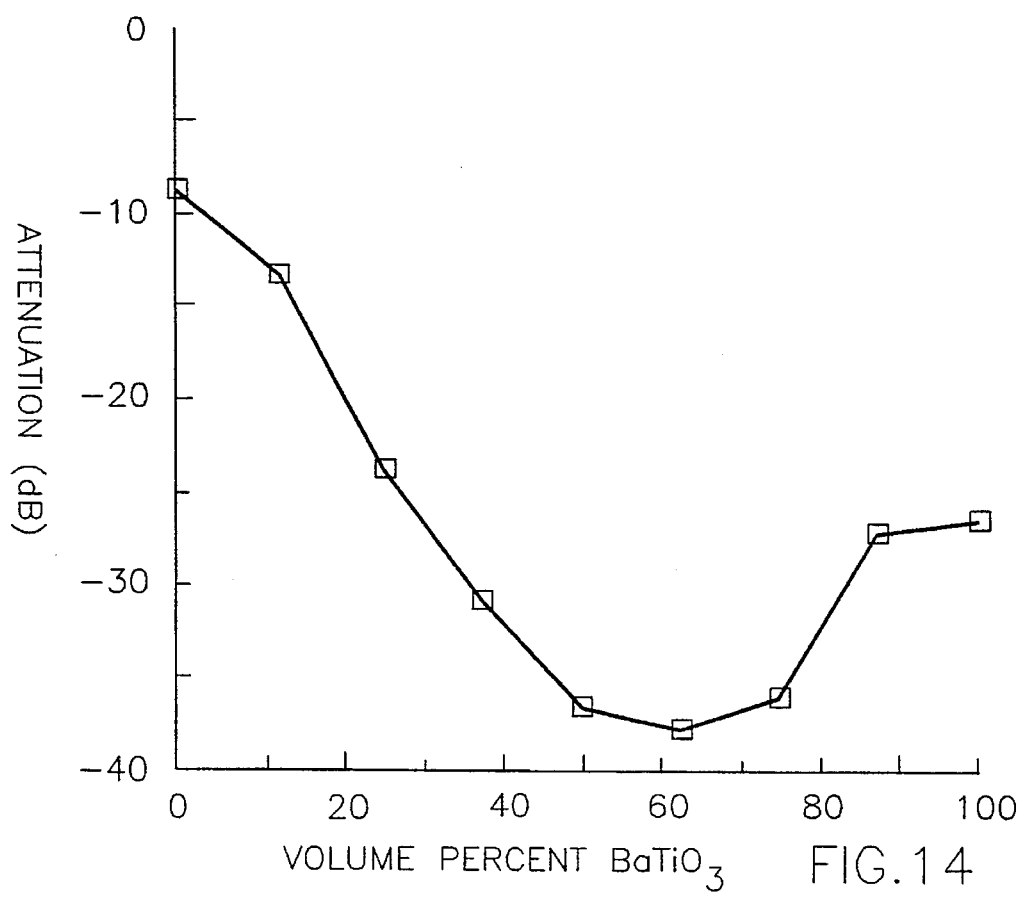
Figure 15:
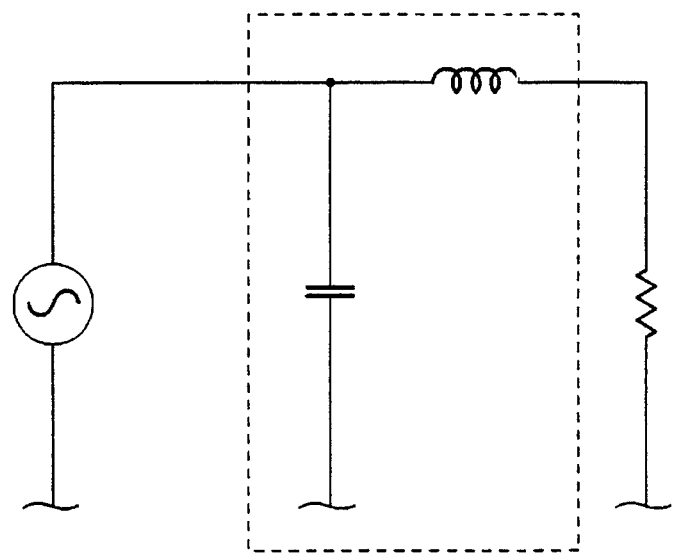
FIG. 15 is a schematic of a prior art filter.

Though the ferroelectric-ferromagnetic composites did not exhibit attenuation capabilities superior to the pure barium titanate bead at frequencies below about 200 MHz, these composites also did not exhibit the resonance noted with the pure barium titanate at about 400 MHz. The absence of resonance in the ferroelectric-ferromagnetic composite beads resulted in better attenuation at frequencies exceeding about 200 MHz. The 62.5% barium titanate composite bead exhibited the maximum attenuation of any of the samples tested, with approximately −38 dB attenuation at about 1 GHz. For comparison, FIGS. 13 and 14 illustrate attenuation capability versus volume percent barium titanate for the data gathered at 200 MHz and 1 GHz.

Figure 10:
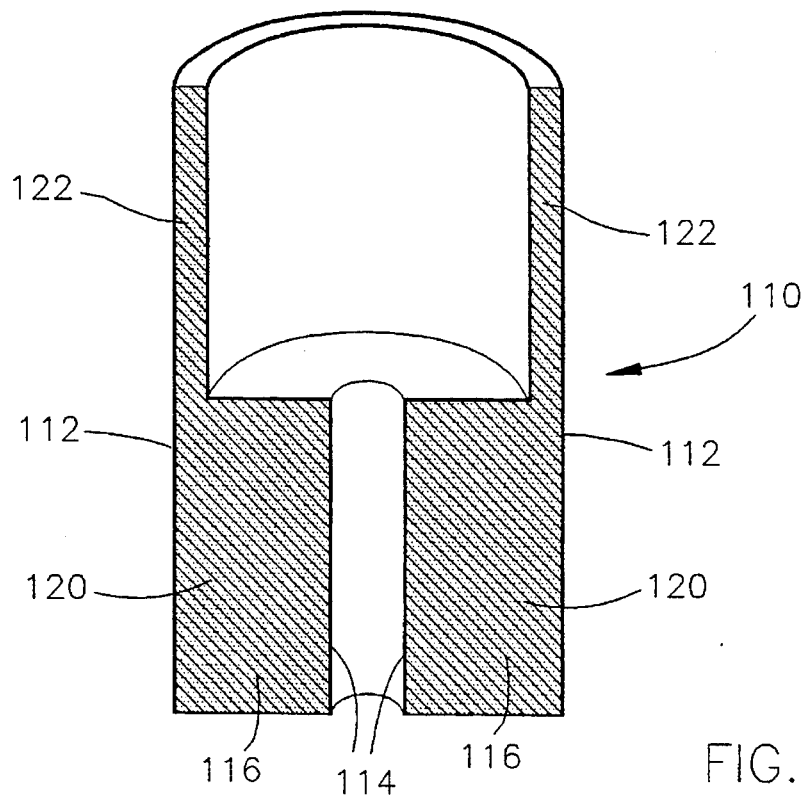
FIG. 10 shows in cross-section a second ferroelectric-ferromagnetic composite device in accordance with this invention.

For purposes of evaluating the ability to enhance the capacitive and inductive properties of the ferroelectric-ferromagnetic composite material, the previously-described processing methods were employed to form beads 110 such as that shown in FIG. 10. The dimensions of the beads 110 were identical to that of the first beads 10 tested, with the exception that the 0.05 inch bore was greatly enlarged to about 0.21 inch for approximately one half the length of the bead 110. This produced a relatively thick-walled high inductance region 120 and a relatively thin-walled high capacitance region 122 in the bead 110.

As before, the beads 110 were then coated with the silver electrodes 112 and 114 as shown. As seen by reference to FIGS. 11 and 12, beads 110 were formed with two different volume percent proportions of the ferroelectric and ferromagnetic materials—a 62.5% barium titanate, 37.5% copper zinc magnesium ferrite composite (FIG. 11), and a 75% barium titanate, 25% copper zinc magnesium ferrite composite (FIG. 12). The beads 110 were tested in the same manner as before, using a conventional vector network analyzer. The attenuation provided by each bead 110 can be seen in FIGS. 11 and 12, while the graphs are numerically summarized in Table II below.

TABLE II

| COMPOSITE (VOLUME %) | ATTENUATION IN dB | | | |
|---|---|---|---|---|
| | 100 MHz | 200 MHz | 500 MHz | 1 GHz |
| 62.5 BaTiO3 | −26 dB | −29 dB | −37 dB | −50 dB |
| 75% BaTiO3 | −31 dB | −34 dB | −36 dB | −56 dB |

Figure 11:
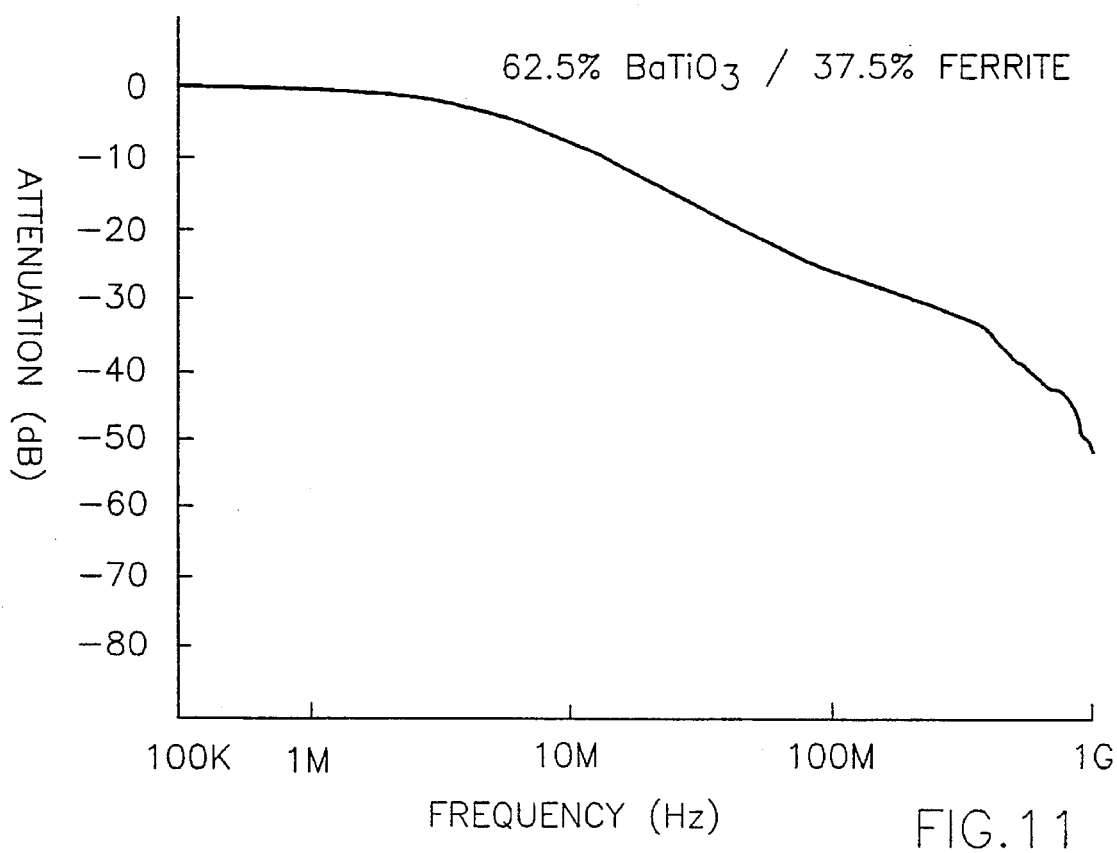
FIGS. 11 and 12 graphically show the attenuation capabilities of the bead of FIG. 10 formed from a 62.5% barium titanate-37.5% ferrite composite and a 75% barium titanate-25% ferrite composite by volume.
Figure 12:
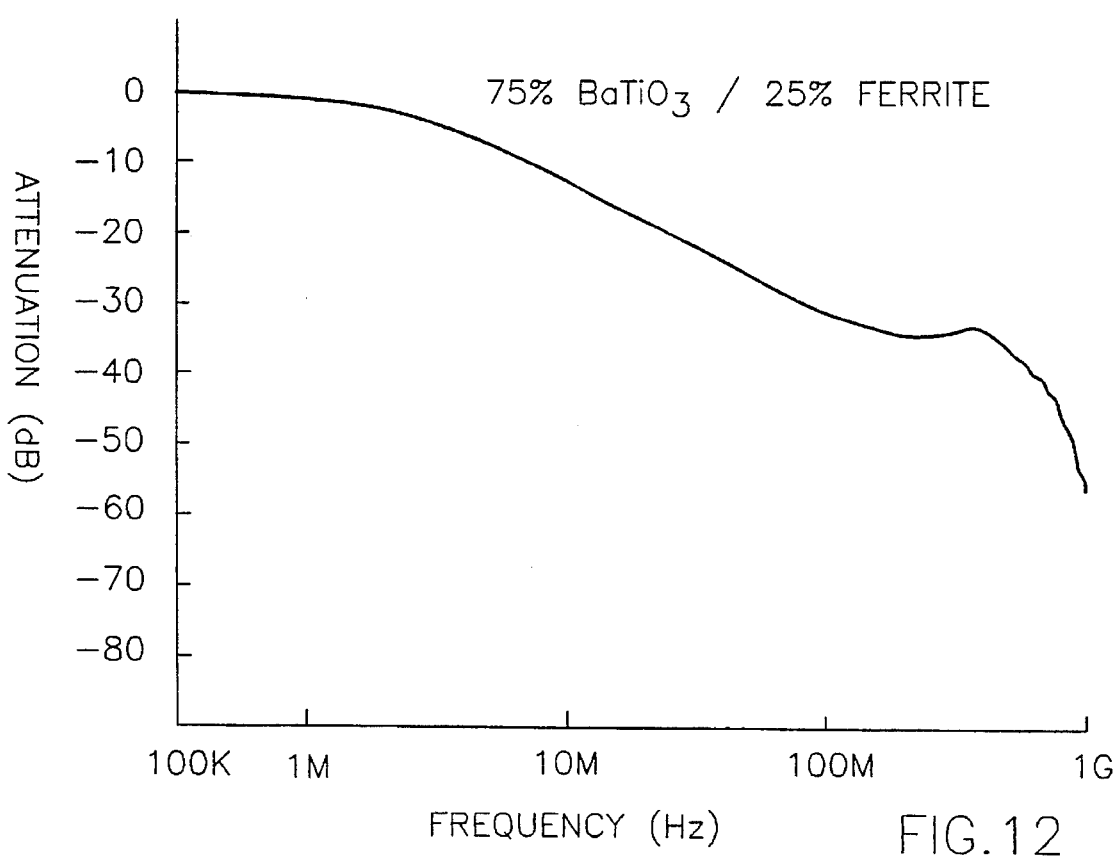

FIGS. 11 and 12 illustrate the potential for enhancing the attenuation properties of the ferroelectric-ferromagnetic composite material by using a geometry that optimizes the ferroelectric and ferromagnetic properties, exemplified by the geometry of FIG. 10. On the average, attenuation was improved by at least an order of magnitude over the same compositions evaluated and discussed under Table I and FIGS. 8 and 9. It is foreseeable that greater enhancement may be achieved with other bead geometries, and can be tailored for particular applications.

From the above, it is apparent that the ferroelectric-ferromagnetic composite material of the present invention is able to suppress high frequency electromagnetic interference, particularly at frequencies above about 10 MHz. Moreover, electromagnetic interference suppression is attainable up to at least about 1 GHz, and is very likely attainable at frequencies much greater than this. In operation, the inductive capability provided by the ferromagnetic material damps the resonance exhibited by a ferroelectric material alone, providing improved performance at higher noise frequencies.

As a particularly important aspect, the ferroelectric and ferromagnetic materials are combined and consolidated to form the composite material in a manner that ensures that the microstructure of the solid ferroelectric-ferromagnetic composite is characterized by relatively large grains for both the ferroelectric and ferromagnetic materials. As such, chemical interaction between the ferroelectric and ferromagnetic materials is substantially absent to permit the materials to remain discrete particles within the ferroelectric-ferromagnetic composite material, so as to retain their respective permittivity and permeability properties. This result is highly unexpected, in that some chemical reaction between the ferroelectric and ferromagnetic materials would be expected. However, substantially no detrimental interaction was discovered by x-ray diffraction.

As evident from the data, the relative quantities of the materials can be chosen to effect the final properties of the ferroelectric-ferromagnetic composite and can vary widely, though the final ferroelectric and ferromagnetic properties will be effected by the geometry of the bead. In addition, the processing used serves to minimize porosity in the composite material so as to maximize the effective permittivity and permeability of the composite while also optimizing its strength and toughness to resist chipping and cracking.

The ferroelectric-ferromagnetic composite can be formed as a compact unitary element which singularly exhibits both inductive and capacitive properties to act as an LC-type electrical filter. As such, the ferroelectric-ferromagnetic composite greatly simplifies the manufacturing of various filter geometries which can be adapted to influence the inductive and capacitive properties of the composite material. Shaping of the ferroelectric-ferromagnetic composite can be done using routine procedures well known for ceramic materials. The compactness, formability and filtering capability of an electrical filter made according to the teachings of the present invention is therefore highly suitable for suppressing electromagnetic interference from sources internal and external to an automotive environment.

Figure 18:
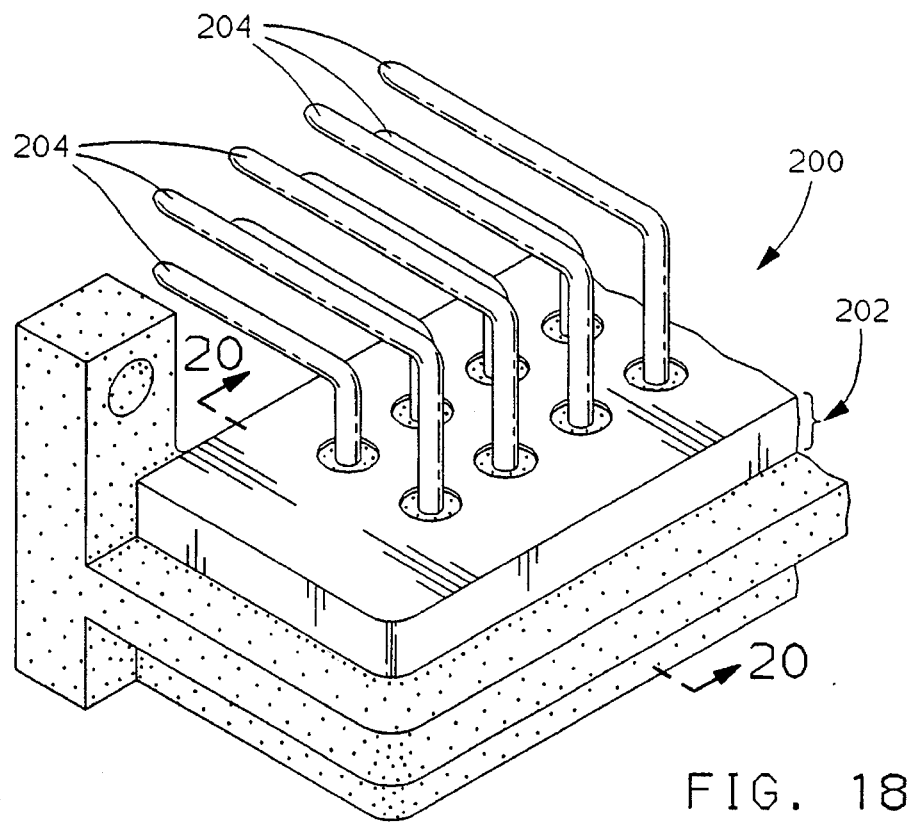
FIG. 18 is an illustration of the filtered-header-connector of the present invention.

FIG. 18 is an illustration of a filtered-header-connector 200 according to the present invention which includes inductor and capacitor components in a single block 202 surrounding the connecting pins 204. The filter according to the present invention eliminates the need for a discrete capacitor for each one of the connector pins (compared to FIG. 16) and provides for greatly enhanced attenuation characteristics.

Figure 19:
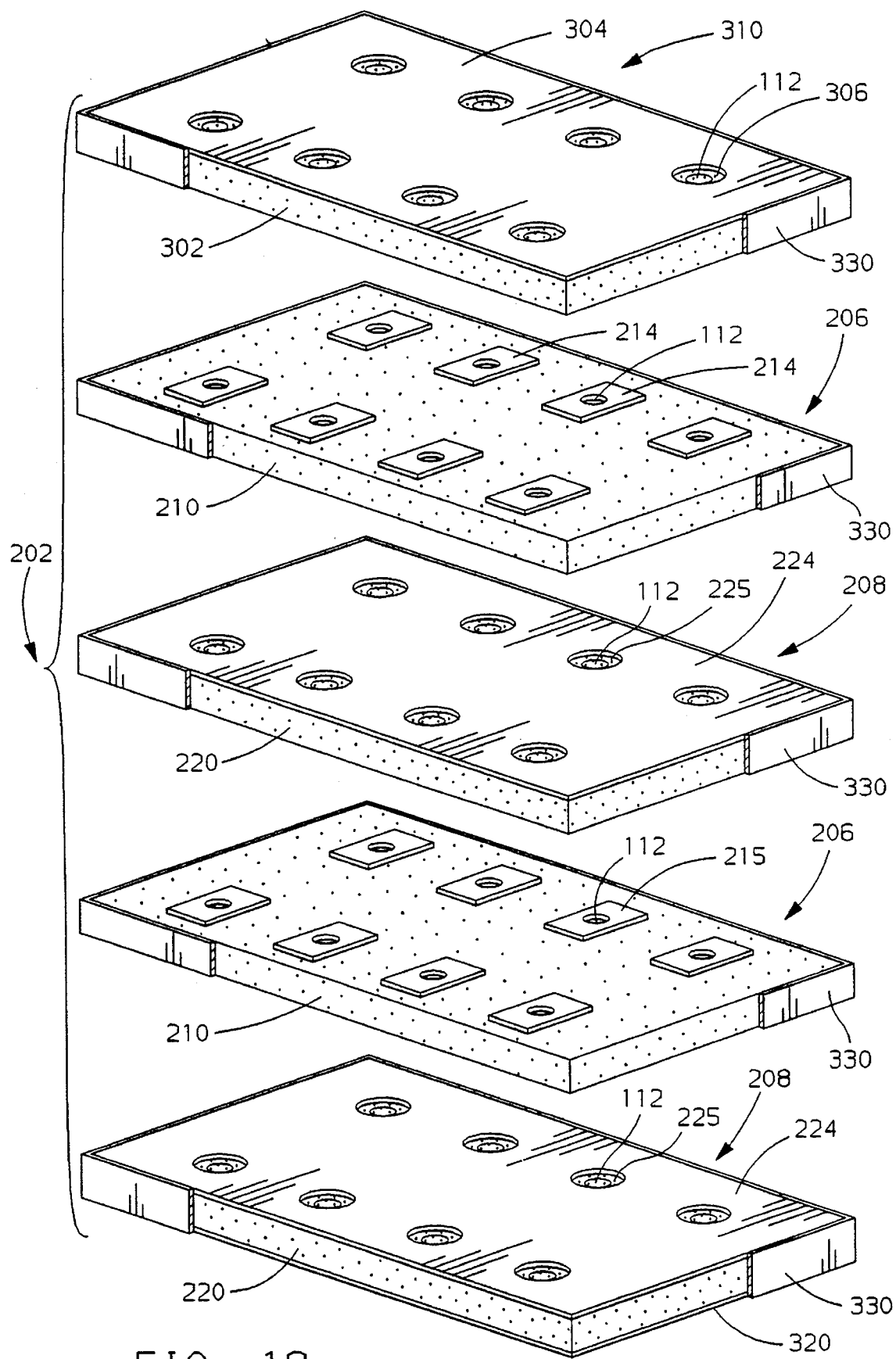
FIG. 19 is an exploded view of a filter element according to the present invention.

FIG. 19 is an enlarged exploded view of element 202 of FIG. 18. The filter element includes repeating first and second component layers 206, 208. The first component layer 106 includes a ferroelectric-ferromagnetic composite layer 210 according to the present invention. Clearance holes 112 for pins are formed through the ferroelectric-ferromagnetic layer. Metallization 214 is selectively deposited in an area immediately adjacent each clearance hole but not entirely across the ferroelectric-ferromagnetic composite layer.

The second component layer 208 includes a ferroelectric-ferromagnetic composite 220 according to the present invention through with clearance holes 112 for connector pins are formed. A metallization plane 224 is deposited everywhere except for a pin isolation area 225 formed immediately adjacent the pin clearance holes 112 where no metallization is deposited.

Ground layer 310 is formed on the top of the structure including a ferroelectric-ferromagnetic layer 302 and a metallization layer 304 is deposited everywhere except that a pin isolation area 306 is formed immediately adjacent the pin clearance holes 112 for the pins where no metallization is deposited.

A ground metallization 320 is deposited on the bottom of the sandwich structure everywhere except that a pin isolation area 322 is formed immediately adjacent the clearance hole 112 for the pins where no metallization is deposited.

Metallization walls 330 (FIG. 20) are formed on the sides of the sandwich structure.

Figure 16:
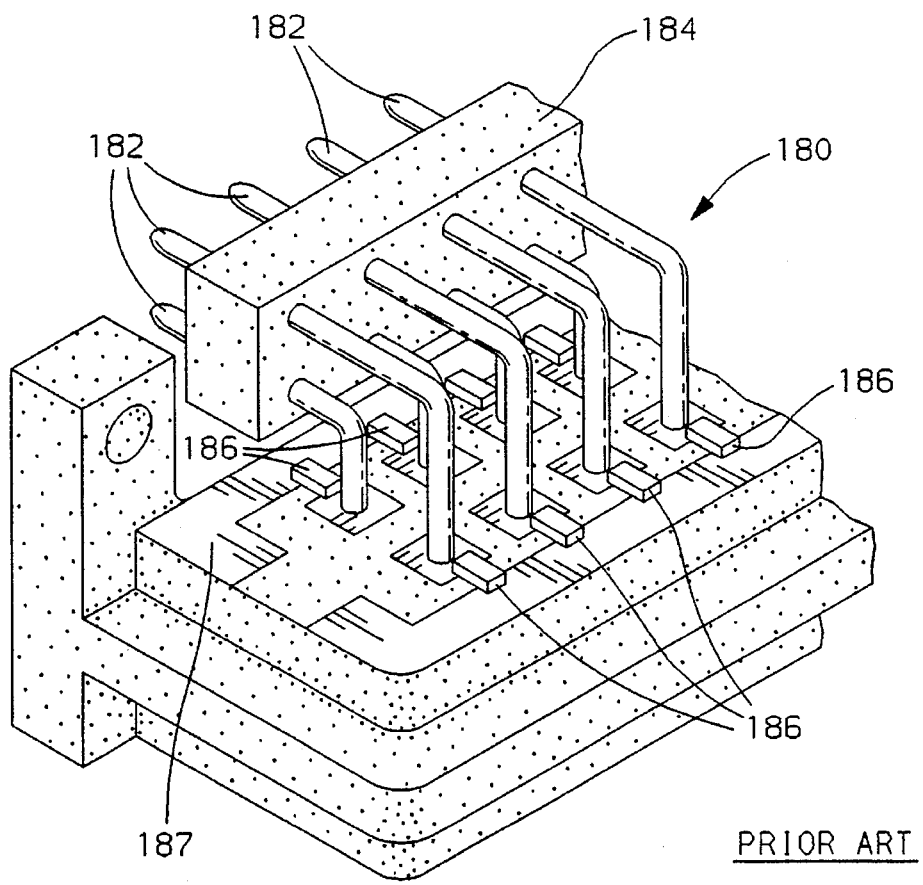
FIG. 16 is an illustration of a prior art filter.
Figure 17:
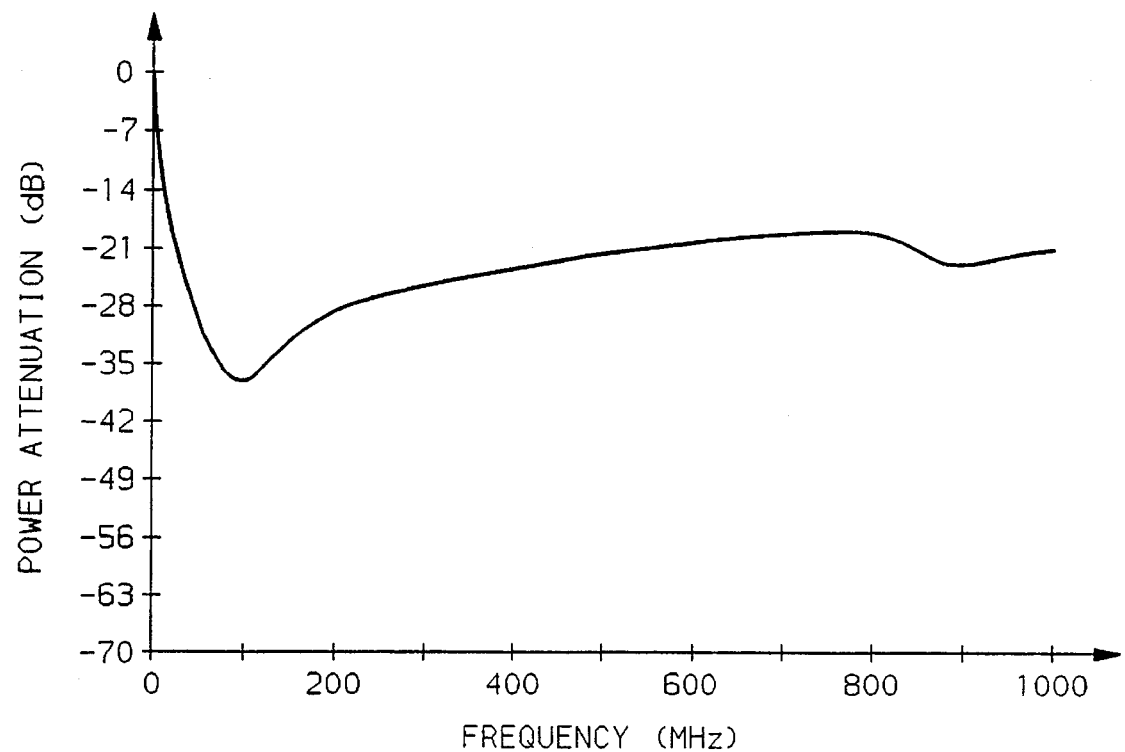
FIG. 17 is a plot of the attenuation characteristics of the filter illustrated in FIG. 16.
Figure 20:
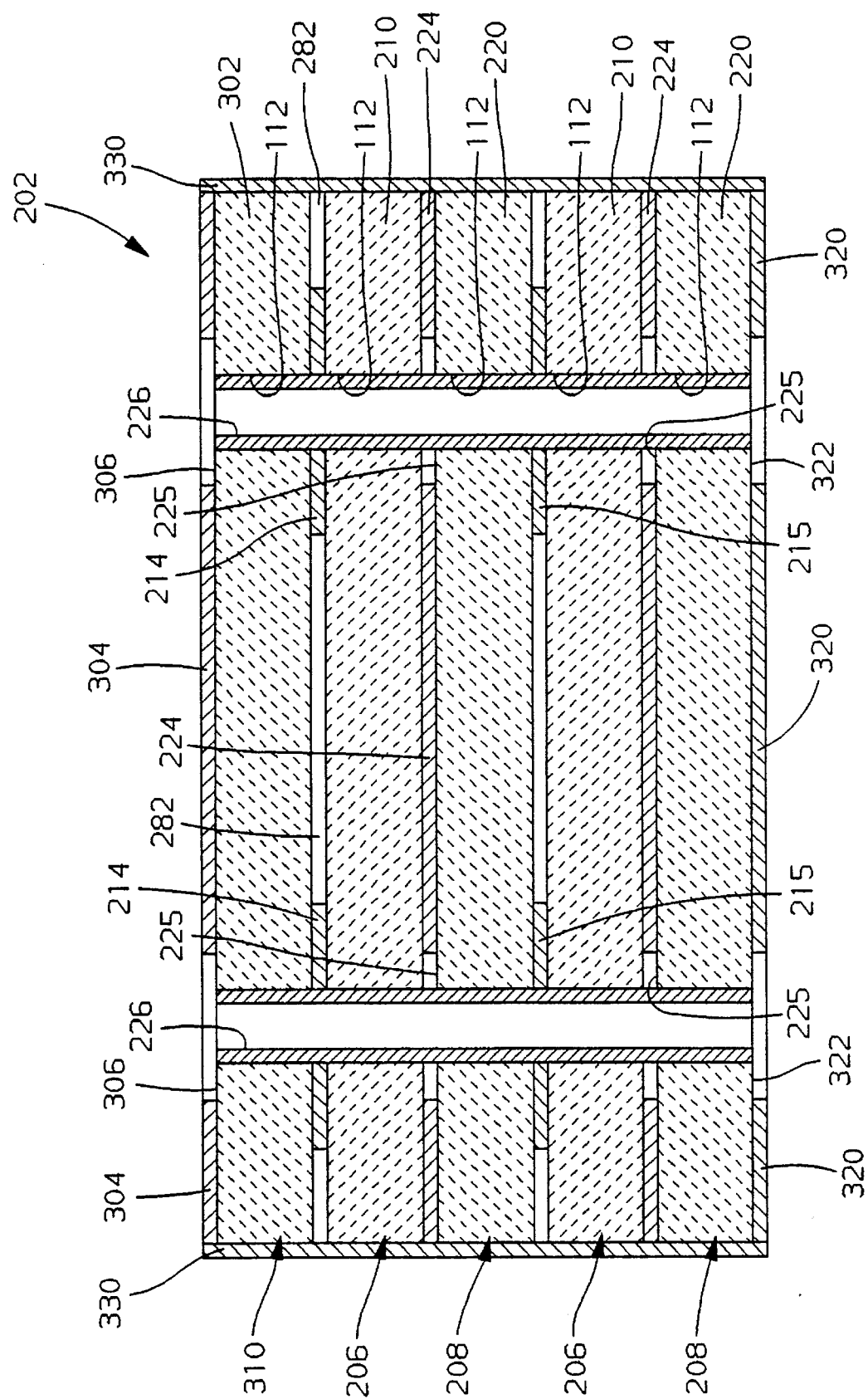
FIG. 20 is an enlarged, partial cross-section taken along lines 20—20 of the filter of FIG. 18.

As shown in FIG. 20, the two component layers are repeated one on top of the other to form a sandwich structure. A metallization wall 226 is formed on the surfaces defining the pin channel clearance holes to provide a metal connection between the metallization 214 of the first component layer to the metallization 215. A metallization wall 330 is also formed along the sides of the sandwich structure. As shown in FIG. 20, before the layers are sintered together a gap or isolation area 225 exist between the composite layers (210 and 220) and the metallization 226 along the walls of the clearance holes for the pins. A second gap 282 surrounds metallization pads 214. When the layers are sintered together, the gaps are filled by ferroelectric-ferromagnetic material from both the first and second component layers. The metallization 214,224,226 is formed on the component layers by methods known to those skilled in the art, such as screen printing a silver based ink, or by dabbing or by hand. The first component layer 206 and second component layer 208 can be repeated as desired. The structure may be terminated on the top by capacitor layer 310 and on the bottom of ground plane 320, respectively. Thus, the discrete capacitors of FIG. 16 are replaced by the alternating metallized layers and a connection to ground as shown in FIG. 19, and the block inductor of FIG. 16 is replaced by the full volume of the capacitor structure of FIG. 19.

In another embodiment, the structure shown in FIG. 19 may be repeated with a ferrite block inserted between the repeating structures shown in FIG. 19 and co-sintered together into a single block to achieve constant attenuation characteristics out to 1 GHz. While the immediate benefit to such an electrical filter is for electromagnetic interference suppression for electrical components, and particularly automotive electrical harness connectors, it is believed that the teachings of this invention could also be extended to magneto-strictive, electro-strictive and antennae applications.

Therefore, while our invention has been described in terms of a preferred embodiment, it is apparent that other forms could be adopted by one skilled in the art, for example by modifying the processing parameters such as the temperatures or durations employed, or by substituting other appropriate ferroelectric and ferromagnetic materials, or by introducing additional processing steps.

Filters according to the present invention can be formed with properties tailored to match or greatly exceed or match the performance of existing passive filter networks now in production. Unlike filters formed from conventional materials, the present filters continue to be effective to frequencies in the GHz region. The monolithic structure of these present filters offers a reduction of parts, greater reliability and reduced cost.

The embodiments of the invention in which an exclusive property or privilege is claimed are defined as follows:

1. A composite ferroelectric-ferromagnetic material for use as an electrical filter, said material consisting essentially of:

a first phase of grains of a ferroelectric material and a second phase of grains of a ferromagnetic material wherein the first phase is interconnected to a second phase and so that said ferroelectric and ferromagnetic grains substantially retain their respective discrete electromagnetic properties;

said composite ferroelectric-ferromagnetic material having a closed porosity ranging from 0 to 3 volume percent of the composite, wherein said composite ferroelectric-ferromagnetic material is suitable for reducing electromagnetic interference of an electrical lead, and said composite having a capacitive loss, which is the imaginary permittivity/real permittivity, of less than 0.1 at one Khz, and said ferromagnetic material is present in about 30 to about 70 percent by volume of the composite and said ferroelectric material is present in about 30 to about 70 percent by volume of the composite, and wherein said ferromagnetic material is a copper-based ferrite, and said ferroelectric material is selected from the group consisting of barium-based and strontium-based materials, wherein said copier-based ferrite is of the $AB_2O_4$ type where A is Cu and at least one selected from the group consisting of Mg, Zn, Ni and Mn, and B is primarily Fe, and including MgO in excess of the stoichiometric amount for a $AB_2O_4$ compound.

2. A composite ferroelectric-ferromagnetic material as recited in claim 1 wherein said ferroelectric material is selected from the group consisting of barium strontium titanate, barium strontium niobate, barium copper tantalate and barium titanate.

3. A composite as set forth in claim 1 wherein said ferromagnetic material comprises $Cu_{0.2}Mg_{0.4}Zn_{0.5}Fe_2O_4$.

4. A composite as set forth in claim 3 wherein said ferroelectric material consists essentially of at least one selected from the group consisting of barium strontium titanate, barium strontium niobate, barium copper tantalate and barium titanate.

5. A composite as set forth in claim 3 wherein said ferroelectric material consists essentially of barium titanate.

6. A composite as set forth in claim 1 wherein said ferroelectric material is barium titanate present in 62.5% by volume of the composite and said ferromagnetic material is $Cu_{0.2}Mg_{0.4}Zn_{0.5}Fe_2O_4$ present in 37.5% by volume of the composite.

7. A composite as set forth in claim 1 wherein A is selected to include a low sintering material that lowers the melting point of the ferromagnetic material so that the composite has a porosity ranging from 0 to 1 percent by volume of the composite.

* * * * *

UNITED STATES PATENT AND TRADEMARK OFFICE
CERTIFICATE OF CORRECTION

PATENT NO. : 5,512,196
DATED : April 30, 1996
INVENTOR(S) : Joseph V. Mantese, Adolph L. Micheli, Dennis F. Dungan It is certified that error appears in the above-identified patent and that said Letters Patent is hereby corrected as shown below:

In claim 1, at column 12, line 24, delete "copier-based" and insert

-- copper-based -- in place thereof.

Signed and Sealed this

Nineteenth Day of May, 1998

Attest:

BRUCE LEHMAN

Attesting Officer

Commissioner of Patents and Trademarks